(12) United States Patent
Huang et al.

(10) Patent No.: US 10,944,073 B2
(45) Date of Patent: Mar. 9, 2021

(54) DISPLAY PANEL HAVING A CRACK BARRIER LAYER AND DISPLAY APPARATUS THEREOF

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Zhenxiao Tong, Beijing (CN); Wuyang Zhao, Beijing (CN); Youngyik Ko, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 40 days.

(21) Appl. No.: 16/474,263

(22) PCT Filed: Dec. 5, 2017

(86) PCT No.: PCT/CN2017/114547
§ 371 (c)(1),
(2) Date: Jun. 27, 2019

(87) PCT Pub. No.: WO2019/000841
PCT Pub. Date: Jan. 3, 2019

(65) Prior Publication Data
US 2020/0127228 A1 Apr. 23, 2020

(30) Foreign Application Priority Data
Jun. 30, 2017 (CN) .......................... 201710527449.7

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3283* (2013.01)

(58) Field of Classification Search
CPC ............. H01L 51/5253; H01L 27/3246; H01L 27/3283
See application file for complete search history.

(56) References Cited

U.S. PATENT DOCUMENTS

| 2009/0273589 A1* | 11/2009 | Asano ................. H01L 27/3283 345/204 |
| 2014/0131683 A1* | 5/2014 | Kim .................... H01L 51/5253 257/40 |

FOREIGN PATENT DOCUMENTS

CN    206849868 U    1/2018

OTHER PUBLICATIONS

International Search Report & Written Opinion dated Apr. 4, 2018, regarding PCT/CN2017/114547.

* cited by examiner

*Primary Examiner* — Lex H Malsawma
(74) *Attorney, Agent, or Firm* — Intellectual Valley Law, P.C.

(57) ABSTRACT

The present application discloses a display panel having a display area and a peripheral area. The display panel includes a base substrate; a display unit on the base substrate; an encapsulating layer on a side of the display unit distal to the base substrate and encapsulating the display unit; and a first crack barrier layer on the base substrate and in the peripheral area and forming a first enclosure substantially surrounding a first area. The encapsulating layer includes a first inorganic sub-layer. The first inorganic sub-layer includes a first part enclosed inside the first area by the first crack barrier layer.

16 Claims, 6 Drawing Sheets

DISPLAY PANEL HAVING A CRACK BARRIER LAYER AND DISPLAY APPARATUS THEREOF

CROSS-REFERENCE TO RELATED APPLICATION

This application is a national stage application under 35 U.S.C. § 371 of International Application No. PCT/CN2017/114547, filed Dec. 5, 2017, which claims priority to Chinese Patent Application No. 201710527449.7, filed Jun. 30, 2017, the contents of which are incorporated by reference in the entirety.

TECHNICAL FIELD

The present disclosure relates to display technology, more particularly, to a display panel having a crack barrier layer and a display apparatus thereof.

BACKGROUND

Display panels such as liquid crystal display (LCD) panels and organic light-emitting diode display (OLED) panels have been widely used. In recent years, the display panels have been made in various shapes. e.g., a round shape, a polygonal shape, and a triangular shape.

SUMMARY

In one aspect, the present invention provides a display panel having a display area and a peripheral area, comprising a base substrate; a display unit on the base substrate; an encapsulating layer on a side of the display unit distal to the base substrate and encapsulating the display unit; and a first crack barrier layer on the base substrate and in the peripheral area and forming a first enclosure substantially surrounding a first area; wherein the encapsulating layer comprises a first inorganic sub-layer, and the first inorganic sub-layer comprises a first part enclosed inside the first area by the first crack barrier layer.

Optionally, the first inorganic sub-layer is separated into at least two discontinuous parts segregated by at least the first crack barrier layer; and the at least two discontinuous parts of the first inorganic sub-layer comprise the first part inside the first area and a second part outside the first area.

Optionally, the first inorganic sub-layer further comprises a third part separated from the first part and the second part; and the third part is on a side of the first crack barrier layer distal to the base substrate.

Optionally, the first crack barrier layer has a thickness greater than a total thickness of all inorganic sub-layers of the encapsulating layer.

Optionally, the thickness of the first crack barrier layer is greater than the total thickness of all inorganic sub-layers of the encapsulating layer by a difference in a range of 0.2 μm to 0.5 μm.

Optionally, a side surface of the first crack barrier layer has a slope angle with respect to a surface of the base substrate in a range of approximately 80 degrees to approximately 120 degrees.

Optionally, the slope angle is greater than 90 degrees.

Optionally, the encapsulating layer further comprises an organic sub-layer on a side of the first inorganic sub-layer distal to the base substrate and a second inorganic sub-layer on a side of the organic sub-layer distal to the first inorganic sub-layer; the second inorganic sub-layer comprises a fourth part enclosed inside the first area by the first crack barrier layer.

Optionally, the second inorganic sub-layer is separated into at least two discontinuous parts segregated by the first crack barrier layer; and the at least two discontinuous parts of the second inorganic sub-layer comprise the fourth part on a side of the first part distal to the base substrate and inside the first area, and a fifth part on a side of the second part distal to the base substrate and outside the first area.

Optionally, the second inorganic sub-layer further comprises a sixth part separated from the fourth part and the fifth part, and the sixth part is on a side of the third part distal to the first crack barrier layer.

Optionally, the display panel further comprises a second crack barrier layer on the base substrate and in the peripheral area and forming a second enclosure substantially surrounding a second area; the second area being larger than the first area.

Optionally, the first inorganic sub-layer is separated into at least five discontinuous parts segregated by the first crack barrier layer and the second crack barrier layer, respectively; the at least five discontinuous parts comprise the first part inside the first area, a second part outside the second area, a third part on a side of the first crack barrier layer distal to the base substrate, a seventh part on a side of the second crack barrier layer distal to the base substrate, and an eighth part on the base substrate and between the first crack barrier layer and the second crack barrier layer; and the first part, the second part, the third part, the seventh part, and the eighth part are separated from each other.

Optionally, the second crack barrier layer has a thickness greater than a total thickness of the first inorganic sub-layer and the second inorganic sub-layer of the encapsulating layer.

Optionally, the thickness of the second crack barrier layer is greater than the total thickness of the first inorganic sub-layer and the second inorganic sub-layer of the encapsulating layer by a difference in a range of 0.2 μm to 0.5 μm.

Optionally, the encapsulating layer further comprises an organic sub-layer on a side of the first inorganic sub-layer distal to the base substrate and a second inorganic sub-layer on a side of the organic sub-layer distal to the first inorganic sub-layer; the second inorganic sub-layer comprises a fourth part enclosed inside the first area by the first crack barrier layer.

Optionally, the second inorganic sub-layer is separated into at least five discontinuous parts segregated by the first crack barrier layer and the second crack barrier layer, respectively; the at least five discontinuous parts comprise the fourth part on a side of the first part distal to the base substrate and inside the first area, a fifth part on a side of the second part distal to the base substrate and outside the second area, a sixth part on a side of the third part distal to the first crack barrier layer, a ninth part on a side of the seventh part distal to the second crack barrier layer, and a tenth part on a side of the eighth part distal to the base substrate and between the first crack barrier layer and the second crack barrier layer, and the fourth part, the fifth part, the sixth part, the ninth part, and the tenth part are separated from each other.

Optionally, the fourth part is in contact with the first part, the fifth part is in contact with the second part, the sixth part is in contact with the third part, the ninth part is in contact with the seventh part, and the tenth part is in contact with the eighth part.

Optionally, the display panel comprises a plurality of crack barrier layers including at least the first crack barrier layer; and the crack barrier layer most distal to the display unit has a distance to an edge of the base substrate greater than or equal to 150 μm.

Optionally, each of the plurality of crack barrier layers has a width of approximately 20 μm; and the plurality of crack barrier layers are spaced apart from each other by a distance of approximately 20 μm.

Optionally, the display panel further comprises one or a combination of a spacer layer, a pixel definition layer, a passivation layer; and the first crack barrier layer is in a same layer as, and made of a same material as, one of the spacer layer, the pixel definition layer, and the passivation layer.

Optionally, the first crack barrier layer has a Young's modulus no more than 20 GPa.

Optionally, the first crack barrier layer comprises an organic material.

Optionally, the base substrate is a flexible base substrate.

In another aspect, the present invention provides a display apparatus comprising the display panel described herein or fabricated by a method described herein.

In another aspect, the present invention provides a method of fabricating a display panel, comprising forming a display unit on a base substrate; forming a first crack barrier layer on the base substrate and in the peripheral area; and subsequent to forming the first crack barrier layer, forming an encapsulating layer on a side of the display unit distal to the base substrate to encapsulate the display unit; wherein the first crack barrier layer is formed as a first enclosure substantially surrounding a first area; forming the encapsulating layer comprises forming a first inorganic sub-layer; and the first inorganic sub-layer is formed to comprises a first part which is enclosed inside the first area by the first crack barrier layer.

BRIEF DESCRIPTION OF THE FIGURES

The following drawings are merely examples for illustrative purposes according to various disclosed embodiments and are not intended to limit the scope of the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
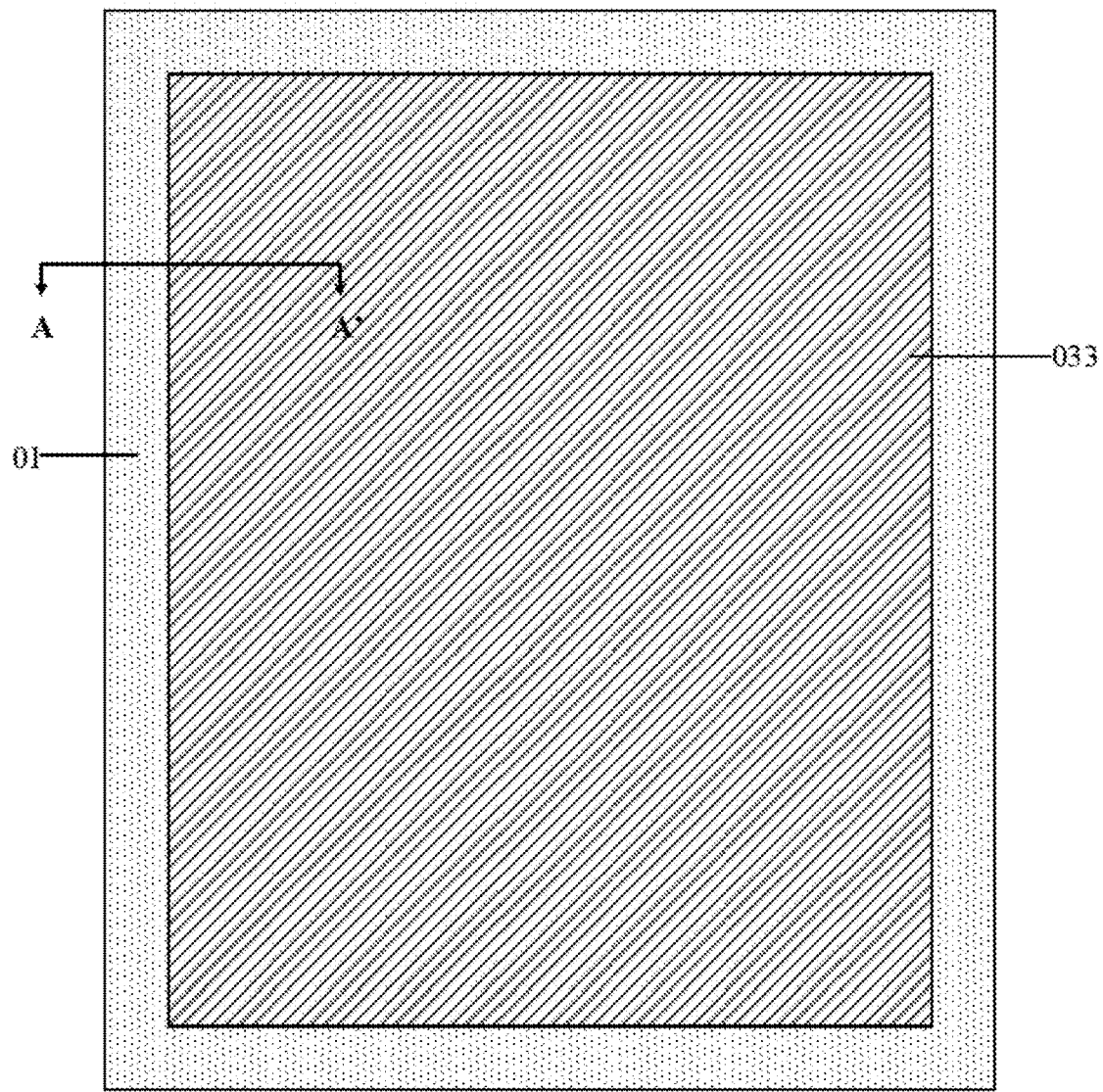
FIG. 1 is a schematic diagram illustrating the structure of a conventional display panel.
Figure 2:
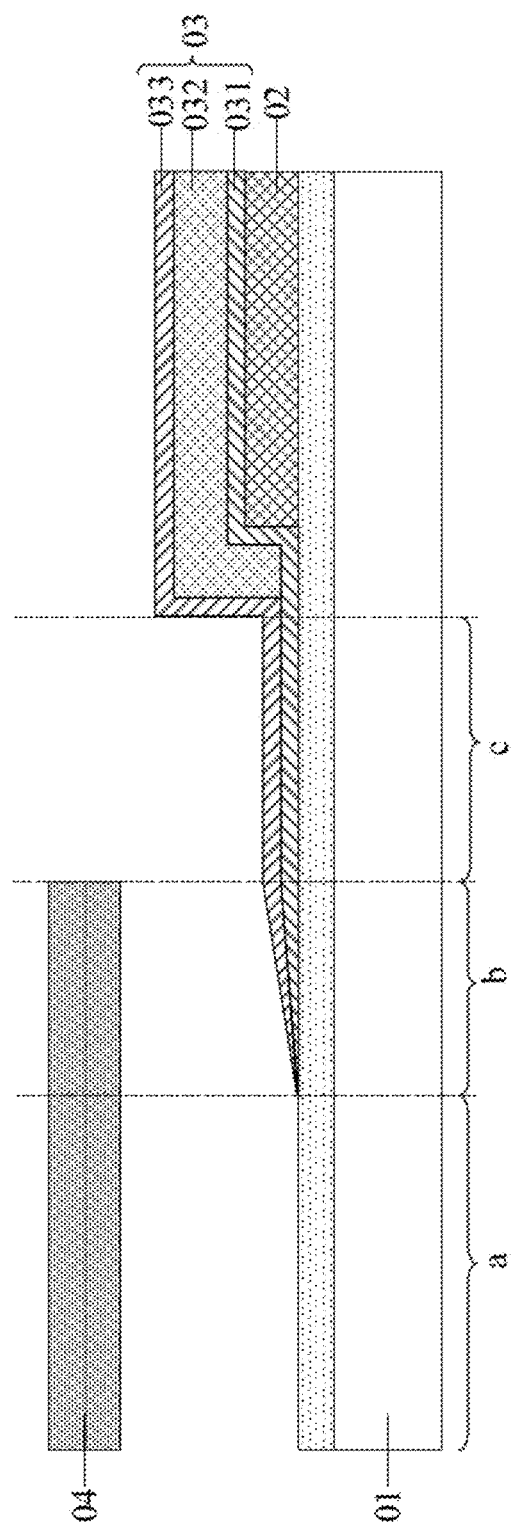
FIG. 2 is a cross-sectional view along the line A-A' in FIG. 1.

FIG. 1 is a schematic diagram illustrating the structure of a conventional display panel. FIG. 2 is a cross-sectional view along the line A-A' in FIG. 1. Referring to FIG. 1 and FIG. 2, the conventional display panel includes an encapsulating layer 03. The encapsulating layer 03 typically includes a first inorganic sub-layer 031, an organic sub-layer 032, and a second inorganic sub-layer 033. The first inorganic sub-layer 031 and the second inorganic sub-layer 033 have a relatively high hardness, effectively blocking moist and oxygen from entering the display unit 02 (e.g., a plurality of organic light emitting diodes) and rendering the organic light emitting diodes to fail. However, the inorganic sub-layers are typically made very thin, e.g., having a thickness less than 1 μm. Thus, the inorganic sub-layers are ineffective in covering and encapsulating small particles, which lead to failure of encapsulation. On the other hand, the organic sub-layer 032 is typically made to have a relatively greater thickness, e.g., having a thickness in a range of approximately 6 μm to approximately 10 μm. The organic sub-layer 032 can effectively cover and encapsulate small particles. Also, the organic sub-layer 032 are made of a flexible material enhancing the flexibility of the encapsulating layer 03. The presence of the organic sub-layer 032, to a certain degree, can prevent propagation of cracks from the inorganic sub-layers to the central portion of the encapsulating layer 03. The organic sub-layer 032, however, is not so effective in blocking moist and oxygen. Typically, a second inorganic sub-layer 033 is required to further encapsulate the organic sub-layer 032.

In conventional process of fabricating the display panel, the first inorganic sub-layer 031 and the second inorganic sub-layer 033 are typically formed by chemical vapor deposition of an inorganic material. In forming the first inorganic sub-layer 031 and the second inorganic sub-layer 033, a mask plate 04 is typically used to keep a safe distance a between the edge of the display panel and the inorganic sub-layers. The use of the mask plate 04 results in a shadow region b in which the inorganic sub-layers have a non-uniform thickness. Moreover, to prevent moist and oxygen from entering the organic sub-layer 032 from the gap between the first inorganic sub-layer 031 and the second inorganic sub-layer 033, a transition region c is required between the inorganic sub-layers and the organic sub-layer 032. Thus, a shadow region b, a transition region c, and a safe distance a are required surrounding the display area in making the conventional display panel.

When the distance between the edge of the base substrate and the inorganic sub-layers (e.g., the first inorganic sub-layer 031 and the third inorganic sub-layer 033) is too small, the cracks generated during the process of cutting a mother substrate into the base substrate 01 are prone to propagate from the peripheral area into the central area of the inorganic sub-layers, resulting in a failure of encapsulation. Moreover, the presence of the shadow region b increases the size of the frame of the display panel, increasing the difficulty in making a narrow-frame display panel. When the display panel has an irregular shape, the encapsulating process is even more complicated, unavoidably increasing the frame size of the display panel.

Accordingly, the present disclosure provides, inter alia, a display panel having a crack barrier layer and a display apparatus thereof that substantially obviate one or more of the problems due to limitations and disadvantages of the related art. In one aspect, the present disclosure provides a display panel having a display area and a peripheral area. In some embodiments, the display panel includes a base substrate; a display unit on the base substrate; an encapsulating layer on a side of the display unit distal to the base substrate and encapsulating the display unit; and a first crack barrier layer on the base substrate and in the peripheral area and forming a first enclosure substantially surrounding a first area. Optionally, the encapsulating layer includes a first inorganic sub-layer. Optionally, the first inorganic sub-layer includes a first part enclosed inside the first area by the first crack barrier layer.

Figure 3:
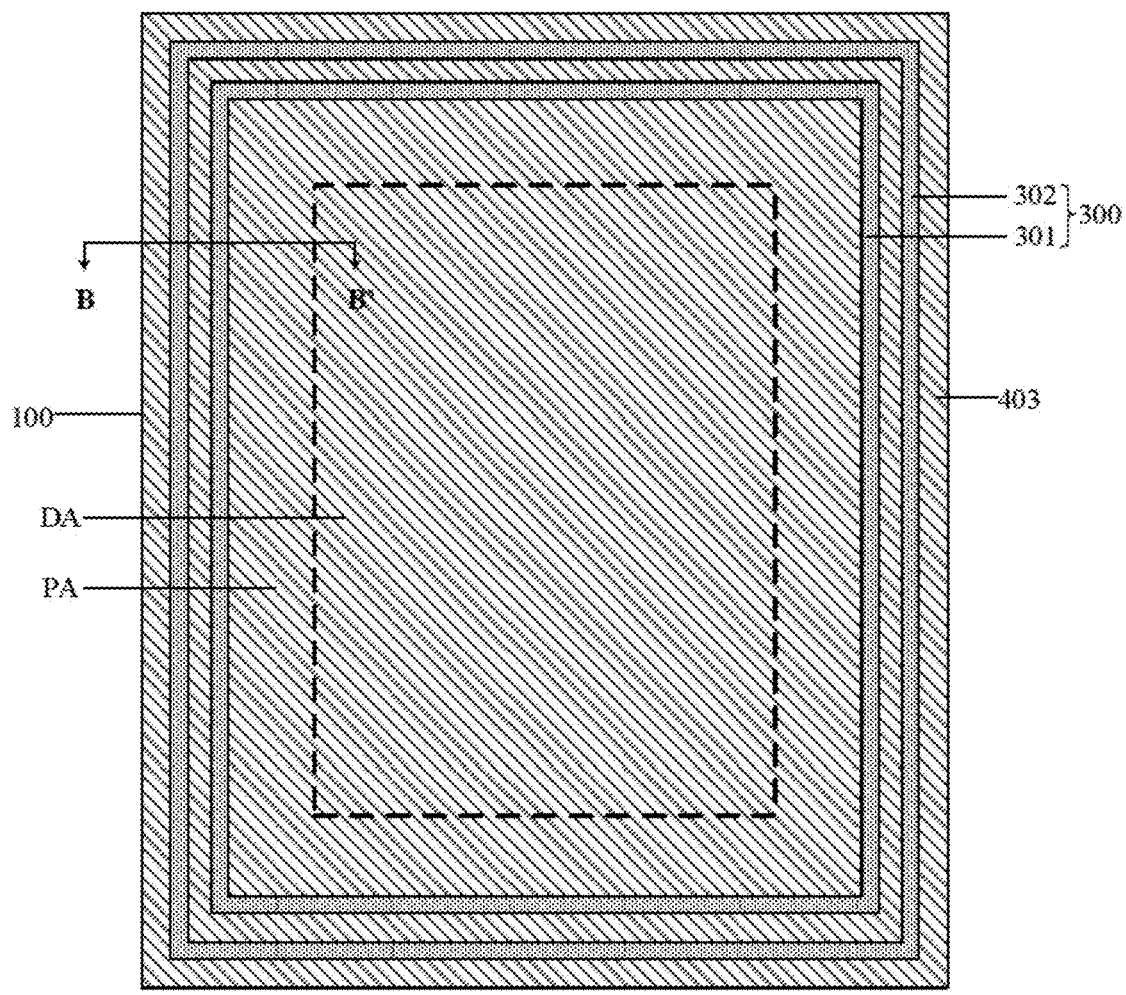
FIG. 3 is a schematic diagram illustrating the structure of a display panel in some embodiments according to the present disclosure.
Figure 4:
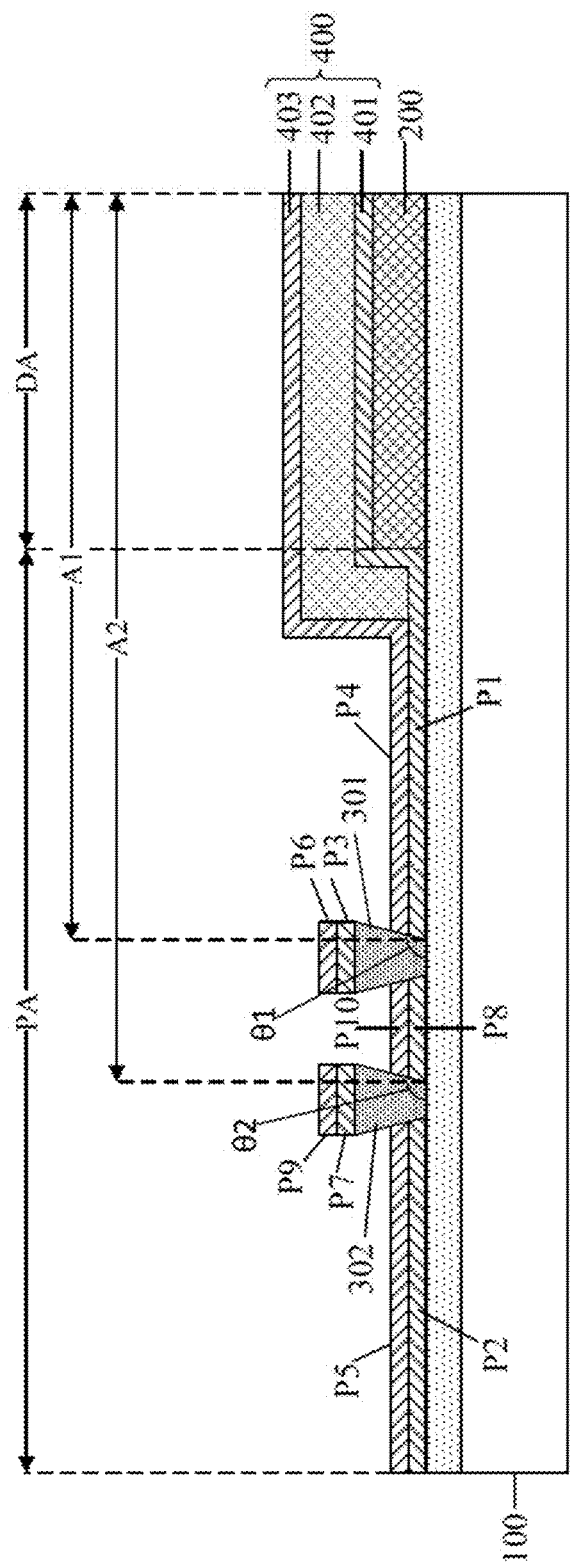
FIG. 4 is a cross-sectional view along the line B-B' in FIG. 3.

FIG. 3 is a schematic diagram illustrating the structure of a display panel in some embodiments according to the present disclosure. FIG. 4 is a cross-sectional view along the line B-B' in FIG. 3. Referring to FIG. 3 and FIG. 4, the display panel has a display area DA and a peripheral area PA. The display panel in some embodiments includes a base substrate 100, a display unit 200 on the base substrate 100, an encapsulating layer 400 on a side of the display unit 200 distal to the base substrate 100 and encapsulating the display unit 200, and a first crack barrier layer 301 on the base substrate 100 and in the peripheral area PA. The first crack barrier layer 301 forms a first enclosure substantially surrounding a first area A1. The first area A1 includes the display area DA and partially extends into the peripheral area PA.

The encapsulating layer 400 in some embodiments includes a first inorganic sub-layer 401. The first inorganic sub-layer 401 includes a first part P1 enclosed inside the first area A1 by the first crack barrier layer 301. The first part P1 stops at the first crack barrier layer 301. For example, the first inorganic sub-layer 401 includes one or more parts including the first part P1. The first part P1 discontinues at the inner side of the first crack barrier layer 301. The inner side of the first crack barrier layer 301 is a side of the first crack barrier layer 301 proximal to the display area DA.

By having one or more crack barrier layers (e.g., the first crack barrier layer 301) in the present display panel, inorganic sub-layers (e.g., the first inorganic sub-layer 401) can be formed into discontinuous parts. At least one of the discontinuous parts (e.g., the first part P1) discontinues at the one or more crack barrier layers (e.g., the first crack barrier layer 301). By having this design, when the inorganic sub-layers (e.g., the first inorganic sub-layer 401) is cracked due to damages, the crack typically starts on the peripheral part of the inorganic sub-layers. The presence of the one or more crack barrier layers (e.g., the first crack barrier layer 301) in the display panel prevents propagation of the cracks from the peripheral part to the central part of the inorganic sub-layers.

In some embodiments, the first inorganic sub-layer 401 is separated into at least two discontinuous parts segregated by at least the first crack barrier layer 301. The at least two discontinuous parts of the first inorganic sub-layer 401 includes a first part P1 inside the first area A1 and a second part P2 outside the first area A1. Optionally, the first inorganic sub-layer 401 further includes a third part P3 separated from the first part P1 and the second part P2. The third part P3 is on a side of the first crack barrier layer 301 distal to the base substrate 100.

By having one or more crack barrier layers (e.g., the first crack barrier layer 301) in the present display panel, the encapsulating layer 400 can be formed in the display panel without the need of a mask plate, e.g., the encapsulating layer 400 can be formed by depositing one or more encapsulating material on the entire surface of the display panel. Due to the presence of the one or more crack barrier layer, inorganic sub-layers (e.g., the first inorganic sub-layer 401) can be formed into at least two discontinuous parts (e.g., the first part P1, the second part P2, and the third part P3). By having this design, any shadow region in which the encapsulating layer has a non-uniform thickness can be avoided, facilitating fabrication of a display panel having a narrow frame. When the inorganic sub-layers (e.g., the first inorganic sub-layer 401) is cracked due to damages, the crack typically starts on the peripheral part of the inorganic sub-layers (e.g., the second part P2 of the first inorganic sub-layer 401). The presence of the one or more crack barrier layers (e.g., the first crack barrier layer 301) in the display panel prevents propagation of the cracks from the peripheral part to the central part of the inorganic sub-layers. Moreover, the inorganic sub-layers are segregated into several discontinuous parts. A crack in one discontinuous part will not propagate into other discontinuous parts. As a result, the display panel can be made to be highly moist-resistant and oxygen-resistant.

To ensure that the one or more crack barrier layers (e.g., the first crack barrier layer 301) can more effectively prevent propagation of cracking of the encapsulating layer and segregate discontinuous parts of the inorganic sub-layers, the one or more crack barrier layers in some embodiments have a thickness greater than a total thickness of all inorganic sub-layers of the encapsulating layer 400. Optionally, the thickness of the one or more crack barrier layers (e.g., the first crack barrier layer 301) is greater than the total thickness of all inorganic sub-layers of the encapsulating layer 400 by a difference greater than 0.5 μm. Optionally, the thickness of the one or more crack barrier layers (e.g., the first crack barrier layer 301) is greater than the total thickness of all inorganic sub-layers of the encapsulating layer 400 by a difference no more than 0.5 μm. Optionally, the thickness of the one or more crack barrier layers (e.g., the first crack barrier layer 301) is greater than the total thickness of all inorganic sub-layers of the encapsulating layer 400 by a difference greater than 0.2 μm. Optionally, the thickness of the one or more crack barrier layers (e.g., the first crack barrier layer 301) is greater than the total thickness of all inorganic sub-layers of the encapsulating layer 400 by a difference in a range of 0.2 μm to 0.5 μm, e.g., 0.2 μm to 0.3 μm, 0.3 μm to 0.4 μm, and 0.4 μm to 0.5 μm. By having this design, it can be ensured that the discontinuous parts of the inorganic sub-layers are segregated from each other, e.g., the third part P3 is segregated from the first part P1.

In some embodiments, and referring to FIG. 3 and FIG. 4, the encapsulating layer 400 further includes an organic sub-layer. Optionally, and referring to FIG. 3 and FIG. 4, the encapsulating layer 400 further includes an organic sub-layer 402 on a side of the first inorganic sub-layer 401 distal to the base substrate 100. Optionally, the encapsulating layer 400 further includes an organic sub-layer 402 on a side of the first inorganic sub-layer 401 proximal to the base substrate 100. In case the organic sub-layer 402 is on a side of the first inorganic sub-layer 401 proximal to the base substrate 100, the organic sub-layer 402 can effectively encapsulate and covers any fine particles in the display panel, and the first inorganic sub-layer 401 (on a side of the organic sub-layer 402 distal to the display unit 200) encapsulates the organic sub-layer 402 and the display unit 200 underneath, forming a highly moist-resistant and highly oxygen-resistant encapsulating structure.

In some embodiments, and referring to FIG. 3 and FIG. 4, the encapsulating layer includes a first inorganic sub-layer 401, an organic sub-layer 402 on a side of the first inorganic sub-layer 401 distal to the base substrate 100, and a second inorganic sub-layer 403 on a side of the organic sub-layer 402 distal to the first inorganic sub-layer 401. Optionally, the second inorganic sub-layer 403 includes a fourth part P4 enclosed inside the first area A1 by the first crack barrier layer 301. By having two inorganic sub-layers, the encapsulating layer 400 can be made more moist-resistant and oxygen-resistant. The fourth part P4 stops at the first crack barrier layer 301. For example, the second inorganic sub-layer 403 includes one or more parts including the fourth part P4. The fourth part P4 discontinues at the inner side of the first crack barrier layer 301. The inner side of the first crack barrier layer 301 is a side of the first crack barrier layer 301 proximal to the display area DA.

In some embodiments, the second inorganic sub-layer 403 is separated into at least two discontinuous parts segregated by the first crack barrier layer 301. Optionally, the at least two discontinuous parts of the second inorganic sub-layer 403 includes the fourth part P4 on a side of the first part P1 distal to the base substrate 100 and inside the first area A1, and a fifth part P5 on a side of the second part P2 distal to the base substrate 100 and outside the first area A1. Optionally, the second inorganic sub-layer 403 further includes a sixth part P6 separated from the fourth part P4 and the fifth part P5. Optionally, the sixth part P6 is on a side of the third part P3 distal to the first crack barrier layer 301.

In some embodiments, the total thickness of all inorganic sub-layers of the encapsulating layer 400 is approximately 1.2 μm, e.g., the total thickness of the first inorganic sub-layer 401 and the second inorganic sub-layer 403 is approximately 1.2 μm. Optionally, the thickness of the first crack barrier layer 301 is greater than 1.7 μm. Optionally, the thickness of the first crack barrier layer 301 is no more than 1.7 μm. Optionally, the thickness of the first crack barrier layer 301 is greater than 1.4 μm. Optionally, the thickness of the first crack barrier layer 301 is in a range of 1.4 μm to 1.7 μm, e.g., 1.4 μm to 1.5 μm, 1.5 μm to 1.6 μm, and 1.6 μm to 1.7 μm. By having this design, it can be ensured that the discontinuous parts of the inorganic sub-layers are segregated from each other, e.g., the third part P3 is segregated from the first part P1.

Optionally, the first crack barrier layer 301 has a single layer structure. Optionally, the first crack barrier layer 301 has a multi-layer structure.

To ensure that the one or more crack barrier layers (e.g., the first crack barrier layer 301) can more effectively prevent propagation of cracking of the encapsulating layer and segregate discontinuous parts of the inorganic sub-layers (e.g., segregating the third part P3 from the first part P1), the one or more crack barrier layers are made to have a relatively large slope angle. In some embodiments, and referring to FIG. 4, a side surface of the first crack barrier layer 301 has a slope angle θ1 with respect to a surface of the base substrate 100 in a range of approximately 80 degrees to approximately 120 degrees, e.g., approximately 90 degrees to approximately 110 degrees. Optionally, the slope angle θ1 is greater than 90 degrees. The slope angle θ1 of the first crack barrier layer 301 can be controlled to be in a certain range by adjusting the baking temperature and backing duration during the patterning process of the first crack barrier layer 301.

In some embodiments, the display panel further includes one or a combination of a spacer layer, a pixel definition layer, a passivation layer. Optionally, the first crack barrier layer 301 is in a same layer as, and made of a same material as, one of the spacer layer, the pixel definition layer, and the passivation layer. Optionally, the first crack barrier layer 301 is made in a same patterning process as one of the spacer layer, the pixel definition layer, and the passivation layer.

In some embodiments, and referring to FIG. 3 and FIG. 4, the display panel further includes a second crack barrier layer 302 on the base substrate 100 and in the peripheral area PA and forming a second enclosure substantially surrounding a second area A2. Optionally, the second area A2 is larger than the first area A1. The first inorganic sub-layer 401 is separated into at least five discontinuous parts segregated by the first crack barrier layer 301 and the second crack barrier layer 302, respectively. The at least five discontinuous parts include the first part P1 inside the first area A1, a second part P2 outside the second area A2, a third part P3 on a side of the first crack barrier layer 301 distal to the base substrate 100, a seventh part P7 on a side of the second crack barrier layer 302 distal to the base substrate, and an eighth part P8 on the base substrate 100 and between the first crack barrier layer 301 and the second crack barrier layer 302. The first part P1, the second part P2, the third part P3, the seventh part P7, and the eighth part P8 are separated from each other.

In some embodiments, the encapsulating layer 400 further includes an organic sub-layer 402 on a side of the first inorganic sub-layer 401 distal to the base substrate 100 and a second inorganic sub-layer 403 on a side of the organic sub-layer 402 distal to the first inorganic sub-layer 401. Optionally, the second inorganic sub-layer 403 includes a fourth part P4 enclosed inside the first area A1 by the first crack barrier layer 301. In some embodiments, the second inorganic sub-layer 403 is separated into at least five discontinuous parts segregated by the first crack barrier layer 301 and the second crack barrier layer 302, respectively. Optionally, the at least five discontinuous parts includes the fourth part P4 on a side of the first part P1 distal to the base substrate 100 and inside the first area A1, a fifth part P5 on a side of the second part P2 distal to the base substrate 100 and outside the second area A2, a sixth part P6 on a side of the third part P3 distal to the first crack barrier layer 301, a ninth part P9 on a side of the seventh part P7 distal to the second crack barrier layer 302, and a tenth part P10 on a side of the eighth part P8 distal to the base substrate 100 and between the first crack barrier layer 301 and the second crack barrier layer 302. Optionally, the fourth part P4, the fifth part P5, the sixth part P6, the ninth part P9, and the tenth part P10 are separated from each other.

In some embodiments, the second crack barrier layer 302 has a thickness greater than a total thickness of all inorganic sub-layers of the encapsulating layer 400. Optionally, the thickness of the second crack barrier layer 302 is greater than the total thickness of all inorganic sub-layers of the encapsulating layer 400 by a difference greater than 0.5 μm. Optionally, the thickness of the second crack barrier layer 302 is greater than the total thickness of all inorganic sub-layers of the encapsulating layer 400 by a difference no more than 0.5 μm. Optionally, the thickness of the second crack barrier layer 302 is greater than the total thickness of all inorganic sub-layers of the encapsulating layer 400 by a difference greater than 0.2 μm. Optionally, the thickness of the second crack barrier layer 302 is greater than the total thickness of all inorganic sub-layers of the encapsulating layer 400 by a difference in a range of 0.2 μm to 0.5 μm, e.g., 0.2 μm to 0.3 μm, 0.3 μm to 0.4 μm, and 0.4 μm to 0.5 μm. By having this design, it can be ensured that the discontinuous parts of the inorganic sub-layers are segregated from each other, e.g., the sixth part P6 is segregated from the fourth part P4.

Optionally, the fourth part P4 is in contact with the first part P1. Optionally, the fifth part P5 is in contact with the second part P2. Optionally, the sixth part P6 is in contact with the third part P3. Optionally, the ninth part P9 is in contact with the seventh part P7. Optionally, the tenth part P10 is in contact with the eighth part P8.

In some embodiments, the total thickness of all inorganic sub-layers of the encapsulating layer 400 is approximately 1.2 µm, e.g., the total thickness of the first inorganic sub-layer 401 and the second inorganic sub-layer 403 is approximately 1.2 µm. Optionally, the thickness of the second crack barrier layer 302 is greater than 1.7 µm. Optionally, the thickness of the second crack barrier layer 302 is no more than 1.7 pun. Optionally, the thickness of the second crack barrier layer 302 is greater than 1.4 µm. Optionally, the thickness of the second crack barrier layer 302 is in a range of 1.4 µm to 1.7 µm, e.g., 1.4 pin to 1.5 µm, 1.5 µm to 1.6 µm, and 1.6 µm to 1.7 µm. By having this design, it can be ensured that the discontinuous parts of the inorganic sub-layers are segregated from each other, e.g., the fifth part P5 is segregated from the ninth part P9.

Optionally, the second inorganic sub-layer 403 has a single layer structure. Optionally, the second inorganic sub-layer 403 has a multi-layer structure.

To ensure that the one or more crack barrier layers (e.g., the second inorganic sub-layer 403) can more effectively prevent propagation of cracking of the encapsulating layer and segregate discontinuous parts of the inorganic sub-layers (e.g., segregating the fifth part P5 from the ninth part P9), the one or more crack barrier layers are made to have a relatively large slope angle. In some embodiments, and referring to FIG. 4, a side surface of the second crack barrier layer 302 has a slope angle θ2 with respect to a surface of the base substrate 100 in a range of approximately 80 degrees to approximately 120 degrees, e.g., approximately 90 degrees to approximately 110 degrees. Optionally, the slope angle θ2 is greater than 90 degrees. The slope angle θ2 of the second crack barrier layer 302 can be controlled to be in a certain range by adjusting the baking temperature and backing duration during the patterning process of the second crack barrier layer 302.

In some embodiments, the display panel further includes one or a combination of a spacer layer, a pixel definition layer, a passivation layer. Optionally, the second crack barrier layer 302 is in a same layer as, and made of a same material as, one of the spacer layer, the pixel definition layer, and the passivation layer. Optionally, the second crack barrier layer 302 is made in a same patterning process as one of the spacer layer, the pixel definition layer, and the passivation layer.

Optionally, the display panel includes more than two crack barrier layers.

Optionally, the encapsulating layer 400 includes more than two inorganic sub-layers.

To make a narrow-frame display panel, in some embodiments, the one or more crack barrier layers can be disposed at a position close to the edge of the display panel. Optionally, the display panel includes only one crack barrier layer (e.g., the first crack barrier layer 301). Optionally, the display panel includes a plurality of crack barrier layers including at least the first crack barrier layer 301. In some embodiments, the crack barrier layer (e.g., the second crack barrier layer 302 in FIG. 3 and FIG. 4) most distal to the display unit 200 (e.g., most proximal to the edge of the display panel) has a distance to an edge of the base substrate 100 greater than or equal to a distance sufficient for allowing cutting of a mother substrate to form the base substrate 100. Optionally, the crack barrier layer most distal to the display unit 200 has a distance to an edge of the base substrate greater than or equal to 150 µm. Optionally, the distance to the edge of the base substrate 100 is less than 10 mm, e.g., less than 5 mm, less than 1 mm, less than 500 µm, and less than 250 µm.

In some embodiments, the display panel includes a plurality of crack barrier layers to prevent cracking of the inorganic sub-layers of the encapsulating layer 400. Optionally, each of the plurality of crack barrier layers is made to have a certain width, and the plurality of crack barrier layers are spaced apart from each other by a certain distance. Optionally, each of the plurality of crack barrier layers has a width of approximately 20 µm. Optionally, the plurality of crack barrier layers are spaced apart from each other by a distance of approximately 20 µm.

In one example, the display panel includes a first crack barrier layer 301 and a second crack barrier layer 302. Each of the first crack barrier layer 301 and the second crack barrier layer 302 has a width of approximately 20 µm. The first crack barrier layer 301 and the second crack barrier layer 302 are spaced apart by a distance of approximately 20 µm. The second crack barrier layer 301 is spaced apart from the edge of the display panel by a distance of approximately 150 µm. Thus, the distance between the first crack barrier layer 301 and the edge of the display panel is approximately 210 µm. As compared to the conventional display panel, a narrow-frame display panel is made possible according to the present disclosure.

In some embodiments, the base substrate 100 is a flexible base substrate. Various appropriate flexible materials may be used for making the base substrate 100. Examples of appropriate flexible materials for making the base substrate 100 include polyimide, polycarbonate, polyethersulfone, polyethylene terephthalate, polyethylene naphthalate, polyarylate, and fiber-reinforced plastic. Optionally, the base substrate 100 is a transparent base substrate. Optionally, the base substrate 100 is a non-transparent base substrate.

Various appropriate materials may be used for making the one or more crack barrier layers. To effectively prevent cracking of the inorganic sub-layers of the encapsulating layer 400, the one or more crack barrier layers are made of a material have a relatively small Young's modulus. In some embodiments, the one or more crack barrier layers are made of a material having a Young's modules in a range of approximately 2.0 to approximately 20 GPa, e.g., approximately 2.0 to approximately 4.0 GPa, approximately 4.0 to approximately 6.0 GPa, approximately 6.0 to approximately 8.0 GPa, approximately 8.0 to approximately 10 GPa, approximately 10 to approximately 12.5 GPa, approximately 12.5 to approximately 15 GPa, approximately 15 to approximately 17.5 GPa, and approximately 17.5 to approximately 20 GPa. Optionally, the one or more crack barrier layers are made of a material having a Young's modules in a range of approximately 0.5 GPa to approximately 1.5 GPa, e.g., approximately 0.5 GPa to approximately 1.0 GPa and approximately 1.0 GPa to approximately 1.5 GPa.

Optionally, the one or more crack barrier layers include an organic material, e.g., a polymer, an elastomer. Examples of organic materials suitable for making the one or more crack barrier layers include polyimide.

Figure 5:
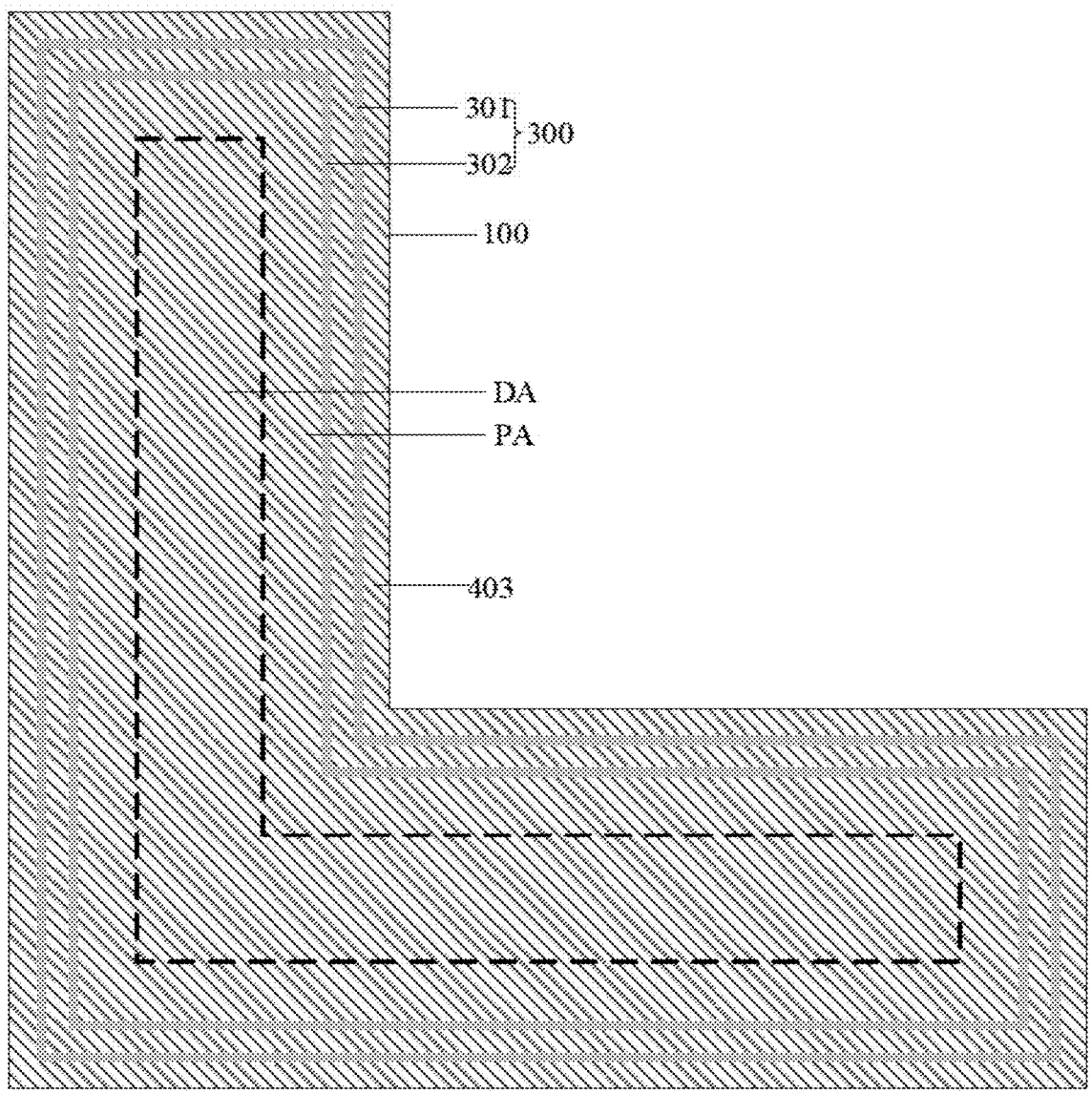
FIG. 5 is a schematic diagram illustrating the structure of a display panel in some embodiments according to the present disclosure.

In some embodiments, the display panel is a display panel having an irregular shape, e.g., a non-square and non-rectangular shape. The one or more crack barrier layers can be formed to have one or more enclosures, which have a shape substantially the same as the irregular shape of the display panel. FIG. 5 is a schematic diagram illustrating the structure of a display panel in some embodiments according to the present disclosure. Referring to FIG. 5, the display panel in some embodiments has a L shape. Accordingly, the one or more crack barrier layers (e.g., the first crack barrier layer 301 and the second crack barrier layer 302) similarly have a L shape, matching the shape of the display panel. By having the one or more crack barrier layers, a narrow-frame display panel can be realized even for a display panel having an irregular shape.

In another aspect, the present disclosure provides a method of fabricating a display panel. In some embodiments, the method includes forming a display unit on a base substrate; forming a first crack barrier layer on the base substrate and in the peripheral area; and subsequent to forming the first crack barrier layer, forming an encapsulating layer on a side of the display unit distal to the base substrate to encapsulate the display unit. Optionally, the first crack barrier layer is formed as a first enclosure substantially surrounding a first area. Optionally, the step of forming the encapsulating layer includes forming a first inorganic sub-layer. Optionally, the first inorganic sub-layer is formed to include a first part which is enclosed inside the first area by the first crack barrier layer.

In some embodiments, the first inorganic sub-layer is formed to have at least two discontinuous parts segregated by at least the first crack barrier layer. Optionally, the at least two discontinuous parts of the first inorganic sub-layer include the first part inside the first area and a second part outside the first area. Optionally, the at least two discontinuous parts of the first inorganic sub-layer further include a third part separated from the first part and the second part. Optionally, the third part is on a side of the first crack barrier layer distal to the base substrate.

Optionally, the first crack barrier layer is formed to have a thickness greater than a total thickness of all inorganic sub-layers of the encapsulating layer. Optionally, the thickness of the first crack barrier layer is greater than the total thickness of all inorganic sub-layers of the encapsulating layer by a difference in a range of 0.2 μm to 0.5 μm.

Optionally, the first crack barrier layer is formed so that a side surface of the first crack barrier layer has a slope angle with respect to a surface of the base substrate in a range of approximately 80 degrees to approximately 120 degrees. Optionally, the slope angle is greater than 90 degrees.

In some embodiments, the step of forming the encapsulating layer further includes forming an organic sub-layer on a side of the first inorganic sub-layer distal to the base substrate, and forming a second inorganic sub-layer on a side of the organic sub-layer distal to the first inorganic sub-layer. Optionally, the second inorganic sub-layer is formed to include a fourth part enclosed inside the first area by the first crack barrier layer. Optionally, the second inorganic sub-layer is formed to include at least two discontinuous parts segregated by the first crack barrier layer. Optionally, the at least two discontinuous parts of the second inorganic sub-layer include the fourth part on a side of the first part distal to the base substrate and inside the first area and a fifth part on a side of the second part distal to the base substrate and outside the first area. Optionally, the second inorganic sub-layer is formed to further include a sixth part separated from the fourth part and the fifth part. Optionally, the sixth part is on a side of the third part distal to the first crack barrier layer.

In some embodiments, the method further includes forming a second crack barrier layer on the base substrate and in the peripheral area. Optionally, the second crack barrier layer is formed as a second enclosure substantially surrounding a second area. Optionally, the second area is larger than the first area. Optionally, the first inorganic sub-layer is formed to include at least five discontinuous parts segregated by the first crack barrier layer and the second crack barrier layer, respectively. Optionally, the at least five discontinuous parts include the first part inside the first area, a second part outside the second area, a third part on a side of the first crack barrier layer distal to the base substrate, a seventh part on a side of the second crack barrier layer distal to the base substrate, and an eighth part on the base substrate and between the first crack barrier layer and the second crack barrier layer. Optionally, the first part, the second part, the third part, the seventh part, and the eighth part are separated from each other.

Optionally, the second crack barrier layer is formed to have a thickness greater than a total thickness of the first inorganic sub-layer and the second inorganic sub-layer of the encapsulating layer. Optionally, the thickness of the second crack barrier layer is greater than the total thickness of the first inorganic sub-layer and the second inorganic sub-layer of the encapsulating layer by a difference in a range of 0.2 μm to 0.5 μm.

In some embodiments, the step of forming the encapsulating layer further includes forming an organic sub-layer on a side of the first inorganic sub-layer distal to the base substrate, and forming a second inorganic sub-layer on a side of the organic sub-layer distal to the first inorganic sub-layer. Optionally, the second inorganic sub-layer is formed to include a fourth part enclosed inside the first area by the first crack barrier layer.

In some embodiments, the second inorganic sub-layer is formed to include at least five discontinuous parts segregated by the first crack barrier layer and the second crack barrier layer, respectively. Optionally, the at least five discontinuous parts include the fourth part on a side of the first part distal to the base substrate and inside the first area, a fifth part on a side of the second part distal to the base substrate and outside the second area, a sixth part on a side of the third part distal to the first crack barrier layer, a ninth part on a side of the seventh part distal to the second crack barrier layer, and a tenth part on a side of the eighth part distal to the base substrate and between the first crack barrier layer and the second crack barrier layer. Optionally, the fourth part, the fifth part, the sixth part, the ninth part, and the tenth part are separated from each other.

Optionally, the first crack barrier layer and the second crack barrier layer are formed so that the fourth part is in contact with the first part. Optionally, the first crack barrier layer and the second crack barrier layer are formed so that the fifth part is in contact with the second part. Optionally, the first crack barrier layer and the second crack barrier layer are formed so that the sixth part is in contact with the third part. Optionally, the first crack barrier layer and the second crack barrier layer are formed so that the ninth part is in contact with the seventh part. Optionally, the first crack barrier layer and the second crack barrier layer are formed so that the tenth part is in contact with the eighth part.

In some embodiments, the method includes forming a plurality of crack barrier layers. Optionally, the crack barrier layer most distal to the display unit is formed at a distance to an edge of the base substrate greater than or equal to 150 μm. Optionally, the plurality of crack barrier layers are formed so that each of the plurality of crack barrier layers has a width of approximately 20 μm, and the plurality of crack barrier layers are spaced apart from each other by a distance of approximately 20 μm.

In some embodiments, the method further includes forming one or a combination of a spacer layer, a pixel definition layer, a passivation layer. Optionally, the first crack barrier layer is formed in a same layer as, and made of a same material as, one of the spacer layer, the pixel definition layer, and the passivation layer. Optionally, the second crack barrier layer is formed in a same layer as, and made of a same material as, one of the spacer layer, the pixel definition layer, and the passivation layer. Optionally, all of the plurality of crack barrier layers are formed in a same layer as, and made of a same material as, one of the spacer layer, the pixel definition layer, and the passivation layer.

Figure 6A:
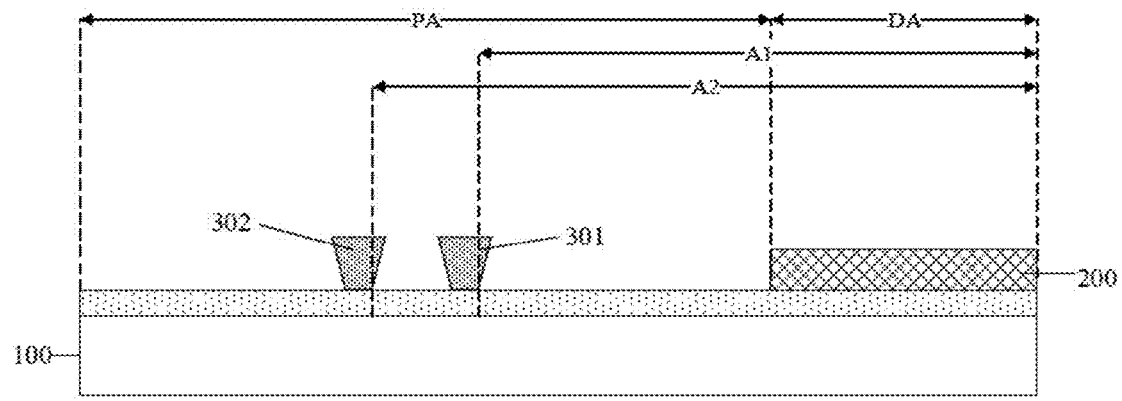
FIGS. 6A to 6C illustrate a process of fabricating a display panel in some embodiments according to the present disclosure.
Figure 6B:
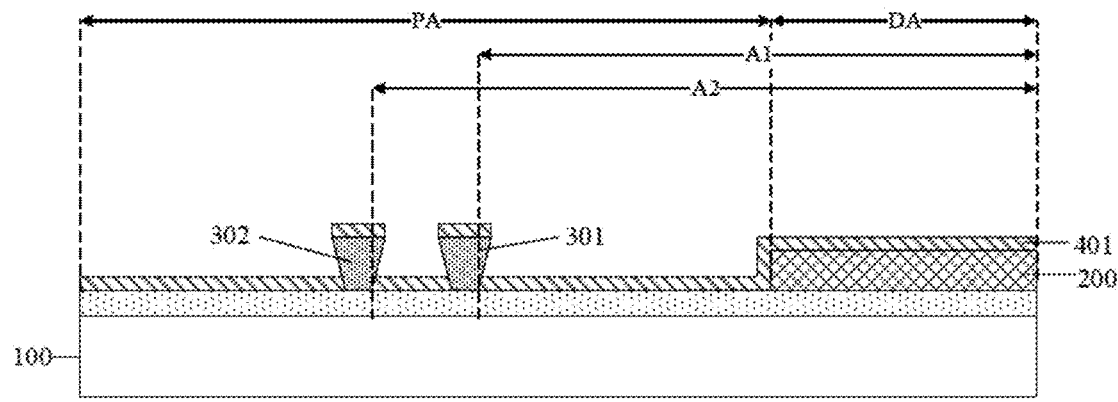
Figure 6C:
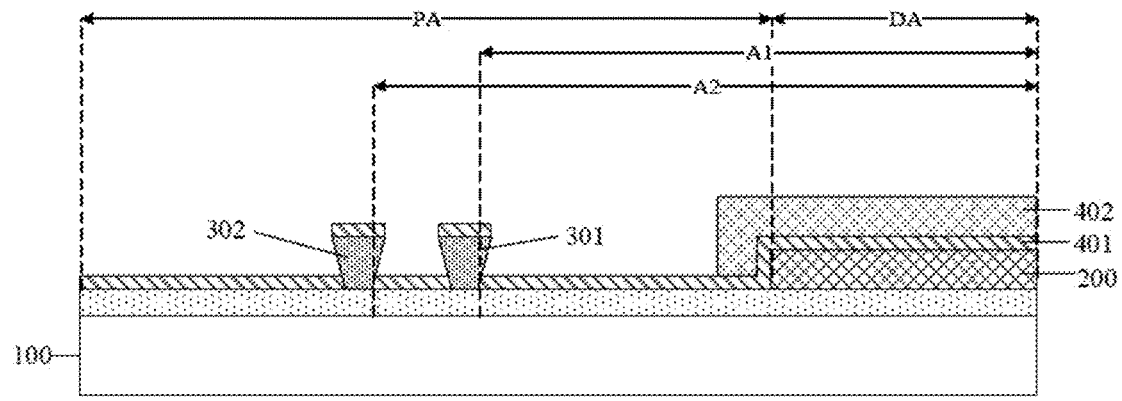

FIGS. 6A to 6C illustrate a process of fabricating a display panel in some embodiments according to the present disclosure. Referring to FIG. 6A, a display unit 200 is formed in the display area DA on a base substrate 100. A first crack barrier layer 301 and a second crack barrier layer 302 are formed in the peripheral area PA on the base substrate 100. The first crack barrier layer 301 forms a first enclosure substantially surrounding a first area A1. The second crack barrier layer 302 forms a second enclosure substantially surrounding a second area A2. The first area A1 is larger than the display area DA, and the second area A2 is larger than the first area A1. The first crack barrier layer 301 is formed so that a side surface of the first crack barrier layer 301 has a slope angle θ1 with respect to a surface of the base substrate 100 greater than 90 degrees. The second crack barrier layer 302 is formed so that a side surface of the second crack barrier layer 302 has a slope angle θ2 with respect to a surface of the base substrate 100 greater than 90 degrees.

Referring to FIG. 6B, a first inorganic sub-layer 401 is formed on a side of the display unit 200 distal to the base substrate 100. The first inorganic sub-layer 401 is formed to include at least five discontinuous parts segregated by the first crack barrier layer 301 and the second crack barrier layer 302, respectively. The at least five discontinuous parts include the first part P1 inside the first area A1, a second part P2 outside the second area A2, a third part P3 on a side of the first crack barrier layer 301 distal to the base substrate 100, a seventh part P7 on a side of the second crack barrier layer 302 distal to the base substrate, and an eighth part P8 on the base substrate 100 and between the first crack barrier layer 301 and the second crack barrier layer 302. The first part P1, the second part P2, the third part P3, the seventh part P7, and the eighth part P8 are separated from each other.

Referring to FIG. 6C, an organic sub-layer 402 is formed on a side of the first inorganic sub-layer 401 distal to the base substrate 100.

Referring to FIG. 4, subsequent to forming the organic sub-layer 402, a second inorganic sub-layer 403 is formed on a side of the organic sub-layer 402 distal to the first inorganic sub-layer 401. The second inorganic sub-layer 403 is formed to include at least five discontinuous parts segregated by the first crack barrier layer 301 and the second crack barrier layer 302, respectively. Optionally, the at least five discontinuous parts includes the fourth part P4 on a side of the first part P1 distal to the base substrate 100 and inside the first area A1, a fifth part P5 on a side of the second part P2 distal to the base substrate 100 and outside the second area A1, a sixth part P6 on a side of the third part P3 distal to the first crack barrier layer 301, a ninth part P9 on a side of the seventh part P7 distal to the second crack barrier layer 302, and a tenth part P10 on a side of the eighth part P5 distal to the base substrate 100 and between the first crack barrier layer 301 and the second crack barrier layer 302. Optionally, the fourth part P4, the fifth part P5, the sixth part P6, the ninth part P9, and the tenth part P10 are separated from each other.

In another aspect, the present disclosure provides a display apparatus including a display panel described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

In the present display panel, display apparatus, and the fabricating method, by having one or more crack barrier layers, inorganic sub-layers of the encapsulating layer 400 can be formed into discontinuous parts. At least one of the discontinuous parts discontinues at the one or more crack barrier layers. By having this design, the presence of the one or more crack barrier layers in the display panel prevents propagation of the cracks from the peripheral part to the central part of the inorganic sub-layers. Moreover, the encapsulating layer 400 can be formed in the display panel without the need of a mask plate, e.g., the encapsulating layer 400 can be formed by depositing one or more encapsulating material on the entire surface of the display panel. Due to the presence of the one or more crack barrier layer, inorganic sub-layers can be formed into at least two discontinuous parts. By having this design, any shadow region in which the encapsulating layer has a non-uniform thickness can be avoided, facilitating fabrication of a display panel having a narrow frame. Moreover, the inorganic sub-layers are segregated into several discontinuous parts. A crack in one discontinuous part will not propagate into other discontinuous parts. As a result, the display panel can be made to be highly moist-resistant and oxygen-resistant.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a display area and a peripheral area, comprising:
a base substrate;
a display unit on the base substrate;
an encapsulating layer on a side of the display unit distal to the base substrate and encapsulating the display unit;
one or a combination of a spacer layer, a pixel definition layer, a passivation layer; and
a first crack barrier layer on the base substrate and in the peripheral area and forming a first enclosure substantially surrounding a first area;
wherein the encapsulating layer comprises a first inorganic sub-layer; and
the first inorganic sub-layer is separated into at least three discontinuous parts segregated by at least the first crack barrier layer;
the at least three discontinuous parts of the first inorganic sub-layer comprise a first part inside the first area, a second part outside the first area, and a third part is on a side of the first crack barrier layer distal to the base substrate;
the first crack barrier layer comprises a single layer organic material structure;
a cross-section of the single layer organic material structure, along a plane perpendicular to a main surface of the base substrate and intersecting the first part, the second part, and the third part, has an inverse trapezoidal shape;
the single layer organic material structure having an inverse trapezoidal shape cross-section is in a same layer as, and made of a same organic material as, one of the spacer layer, the pixel definition layer, and the passivation layer; and
the single layer organic material structure having the inverse trapezoidal shape cross-section is in direct contact with the first part and the third part.

2. The display panel of claim 1, wherein the first crack barrier layer has a thickness greater than a total thickness of all inorganic sub-layers of the encapsulating layer.

3. The display panel of claim 2, wherein the thickness of the first crack barrier layer is greater than the total thickness of all inorganic sub-layers of the encapsulating layer by a difference in a range of 0.2 μm to 0.5 μm.

4. The display panel of claim 1, wherein a side surface of the first crack barrier layer has a slope angle with respect to a surface of the base substrate in a range of approximately 80 degrees to approximately 120 degrees.

5. The display panel of claim 4, wherein the slope angle is greater than 90 degrees.

6. The display panel of claim 1, wherein the encapsulating layer further comprises an organic sub-layer on a side of the first inorganic sub-layer distal to the base substrate and a second inorganic sub-layer on a side of the organic sub-layer distal to the first inorganic sub-layer;
the second inorganic sub-layer comprises a fourth part enclosed inside the first area by the first crack barrier layer.

7. The display panel of claim 6, wherein the second inorganic sub-layer is separated into at least two discontinuous parts segregated by the first crack barrier layer; and
the at least two discontinuous parts of the second inorganic sub-layer comprise the fourth part on a side of the first part distal to the base substrate and inside the first area, and a fifth part on a side of the second part distal to the base substrate and outside the first area.

8. The display panel of claim 7, wherein the second inorganic sub-layer further comprises a sixth part separated from the fourth part and the fifth part; and
the sixth part is on a side of the third part distal to the first crack barrier layer.

9. The display panel of claim 1, further comprising a second crack barrier layer on the base substrate and in the peripheral area and forming a second enclosure substantially surrounding a second area; the second area being larger than the first area.

10. The display panel of claim 9, wherein the first inorganic sub-layer is separated into at least five discontinuous parts segregated by the first crack barrier layer and the second crack barrier layer, respectively;
the at least five discontinuous parts comprise the first part inside the first area, a second part outside the second area, a third part on a side of the first crack barrier layer distal to the base substrate, a seventh part on a side of the second crack barrier layer distal to the base substrate, and an eighth part on the base substrate and between the first crack barrier layer and the second crack barrier layer;
the first part, the second part, the third part, the seventh part, and the eighth part are separated from each other; and
the single layer organic material structure having the inverse trapezoidal shape cross-section is in direct contact with the first part, the third part, and the eighth part.

11. The display panel of claim 10, wherein the encapsulating layer further comprises an organic sub-layer on a side of the first inorganic sub-layer distal to the base substrate and a second inorganic sub-layer on a side of the organic sub-layer distal to the first inorganic sub-layer;
the second inorganic sub-layer comprises a fourth part enclosed inside the first area by the first crack barrier layer.

12. The display panel of claim 11, wherein the second inorganic sub-layer is separated into at least five discontinuous parts segregated by the first crack barrier layer and the second crack barrier layer, respectively;
the at least five discontinuous parts comprise the fourth part on a side of the first part distal to the base substrate and inside the first area, a fifth part on a side of the second part distal to the base substrate and outside the second area, a sixth part on a side of the third part distal to the first crack barrier layer, a ninth part on a side of the seventh part distal to the second crack barrier layer, and a tenth part on a side of the eighth part distal to the base substrate and between the first crack barrier layer and the second crack barrier layer; and
the fourth part, the fifth part, the sixth part, the ninth part, and the tenth part are separated from each other.

13. The display panel of claim 12, wherein the fourth part is in contact with the first part, the fifth part is in contact with the second part, the sixth part is in contact with the third part, the ninth part is in contact with the seventh part, and the tenth part is in contact with the eighth part.

14. The display panel of claim 1, comprising a plurality of crack barrier layers including at least the first crack barrier layer; and
the crack barrier layer most distal to the display unit has a distance to an edge of the base substrate greater than or equal to 150 μm.

15. The display panel of claim 14, wherein each of the plurality of crack barrier layers has a width of approximately 20 μm; and the plurality of crack barrier layers are spaced apart from each other by a distance of approximately 20 μm.

16. The display panel of claim 1, wherein the first crack barrier layer has a Young's modulus no more than 20 GPa.

\* \* \* \* \*